(12) United States Patent
Muchherla et al.

(10) Patent No.: US 11,869,605 B2
(45) Date of Patent: Jan. 9, 2024

(54) ADJUSTING PASS-THROUGH VOLTAGE BASED ON THRESHOLD VOLTAGE SHIFT

(71) Applicant: Micron Technology, Inc., Boise, ID (US)

(72) Inventors: Kishore Kumar Muchherla, Fremont, CA (US); Mustafa N. Kaynak, San Diego, CA (US); Sampath K Ratnam, San Jose, CA (US); Peter Feeley, Boise, ID (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/889,863

(22) Filed: Aug. 17, 2022

(65) Prior Publication Data

US 2022/0392554 A1    Dec. 8, 2022

Related U.S. Application Data

(63) Continuation of application No. 17/188,253, filed on Mar. 1, 2021, now Pat. No. 11,462,280.

(51) Int. Cl.
| | | |
|---|---|---|
| *G11C 16/34* | (2006.01) | |
| *G11C 16/14* | (2006.01) | |
| *G11C 16/08* | (2006.01) | |
| *G11C 16/30* | (2006.01) | |
| *G11C 16/26* | (2006.01) | |

(52) U.S. Cl.
CPC ......... *G11C 16/3459* (2013.01); *G11C 16/08* (2013.01); *G11C 16/14* (2013.01); *G11C 16/26* (2013.01); *G11C 16/30* (2013.01); *G11C 16/3495* (2013.01); *G11C 2207/2254* (2013.01)

(58) Field of Classification Search
CPC ..... G11C 16/3459; G11C 16/08; G11C 16/14; G11C 16/26; G11C 16/30; G11C 16/3495; G11C 2207/2254
See application file for complete search history.

(56) References Cited

U.S. PATENT DOCUMENTS

| | | | | |
|---|---|---|---|---|
| 7,440,327 | B1 * | 10/2008 | Sekar | G11C 16/3418 365/185.21 |
| 8,051,240 | B2 * | 11/2011 | Dutta | G11C 16/26 711/103 |
| 8,933,500 | B2 * | 1/2015 | Lee | H01L 29/42324 257/314 |
| 10,902,924 | B2 | 1/2021 | Park et al. | |
| 11,282,564 | B1 | 3/2022 | Rayaprolu et al. | |

* cited by examiner

*Primary Examiner* — Son L Mai
(74) *Attorney, Agent, or Firm* — Lowenstein Sandler LLP

(57) ABSTRACT

Systems and methods are disclosed including a memory device and a processing device operatively coupled to the memory device. The processing device can perform operations including performing a read operation on a block of the memory device by applying a read reference voltage to a selected wordline of the block and applying a pass-through voltage having a first value to a plurality of unselected wordlines of the block; detecting a read error in response to performing the read operation; and setting the pass-through voltage to a second value, wherein the second value is greater than the first value.

20 Claims, 12 Drawing Sheets

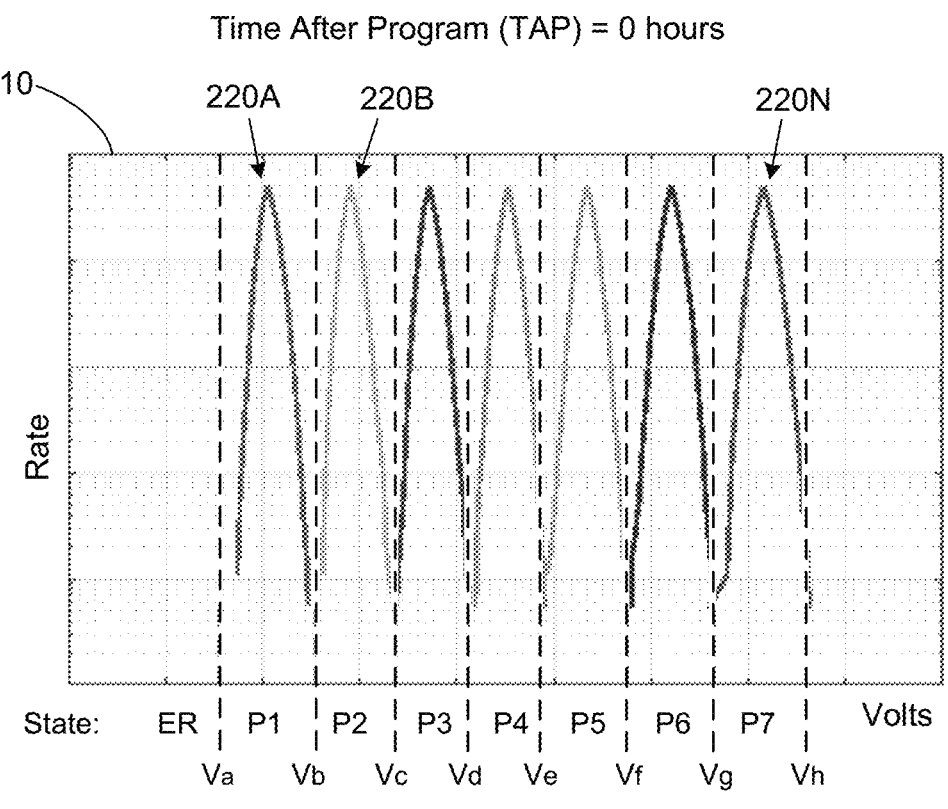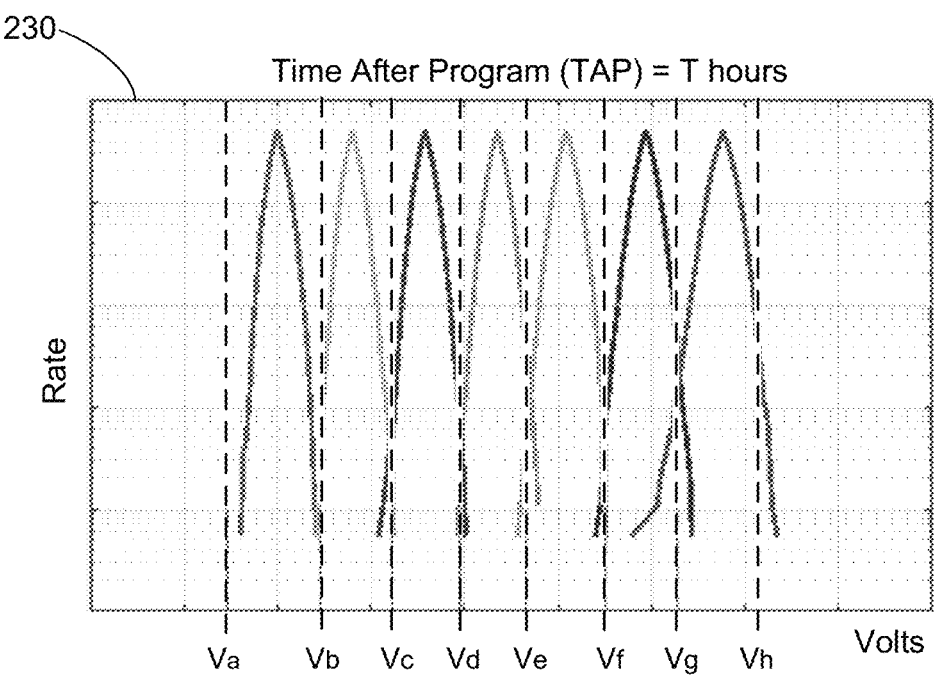
FIG. 2

Voltage Boundary Table 310

| Bin | Boundary |
|---|---|
| 0 | < V1 |
| 1 | < V2 |
| 2 | < V3 |
| 3 | < V4 |
| 4 | < V5 |
| 5 | < V6 |
| 6 | < V7 |
| 7 | >= V7 |

Voltage Offset Table 320

Voltage Bin for TAP=0 hours 322

Voltage Offsets

Voltage Bin for TAP=T hours 324

| Valley\Bin | Bin 0 | Bin 1 | Bin 2 | Bin 3 | Bin 4 | Bin 5 | Bin 6 | Bin 7 |
|---|---|---|---|---|---|---|---|---|
| L1 | V10 | V11 | V12 | V13 | V14 | V15 | V16 | V17 |
| L2 | V20 | V21 | V22 | V23 | V24 | V25 | V26 | V27 |
| L3 | V30 | V31 | V32 | V33 | V34 | V35 | V36 | V37 |
| L4 | V40 | V41 | V42 | V43 | V44 | V45 | V46 | V47 |
| L5 | V50 | V51 | V52 | V53 | V54 | V55 | V56 | V57 |
| L6 | V60 | V61 | V62 | V63 | V64 | V65 | V66 | V67 |
| L7 | V60 | V61 | V62 | V63 | V64 | V65 | V66 | V67 |

FIG. 3

| BLOCK FAMILY METADATA TABLE 720 | | | | | | |
|---|---|---|---|---|---|---|
| Family | Die 0 | Die 1 | ... | Die N-1 | Die N |
| 0 | 7 | 7 | 7 | 7 | 7 |
| 1 | 7 | 7 | 7 | 7 | 7 |
| 2 | 7 | 7 | 7 | 7 | 7 |
| 3 | 7 | 7 | 7 | 7 | 7 |
| 4 | 7 | 7 | 7 | 7 | 7 |
| 5 | 7 | 6 | 7 | 7 | 6 |
| ... | ... | ... | ... | ... | ... |
| 59 | 1 | 1 | 1 | 1 | 1 |
| 60 | 1 | 0 | 1 | 0 | 1 |
| 61 | 1 | 0 | 1 | 0 | 1 |
| 62 | 0 | 0 | 0 | 0 | 0 |
| 63 | 0 | 0 | 0 | 0 | 0 |
| 64 | 0 | 0 | 0 | 0 | 0 |

724 → column "Die N" at Family 5 (Bin 6 736)
722 → column "Die N" at Family 60 (Bin 1 731)

Bin 7 737 — Families 0–4
Bin 6 736 — Family 5
Bin 1 731 — Family 60
Bin 0 730 — Families 61–64

| BLOCK METADATA TABLE 710 | | | |
|---|---|---|---|
| Family | Blocks | Time | Temp |
| 0 | 0-9 | 1 | 31 |
| 1 | 10-19 | 5 | 42 |
| 2 | 20-29 | 6 | ... |
| 3 | 30-39 | 6 | ... |
| 4 | 40-49 | 11 | ... |
| 5 | 50-59 | 14 | ... |
| ... | ... | - | ... |
| 59 | 400-499 | 120 | ... |
| 60 | 500-599 | 121 | ... |
| 61 | 600-699 | 122 | ... |
| 62 | 700-799 | 128 | ... |
| 63 | 800-899 | 145 | ... |
| 64 | 900-999 | 156 | ... |

FIG. 7

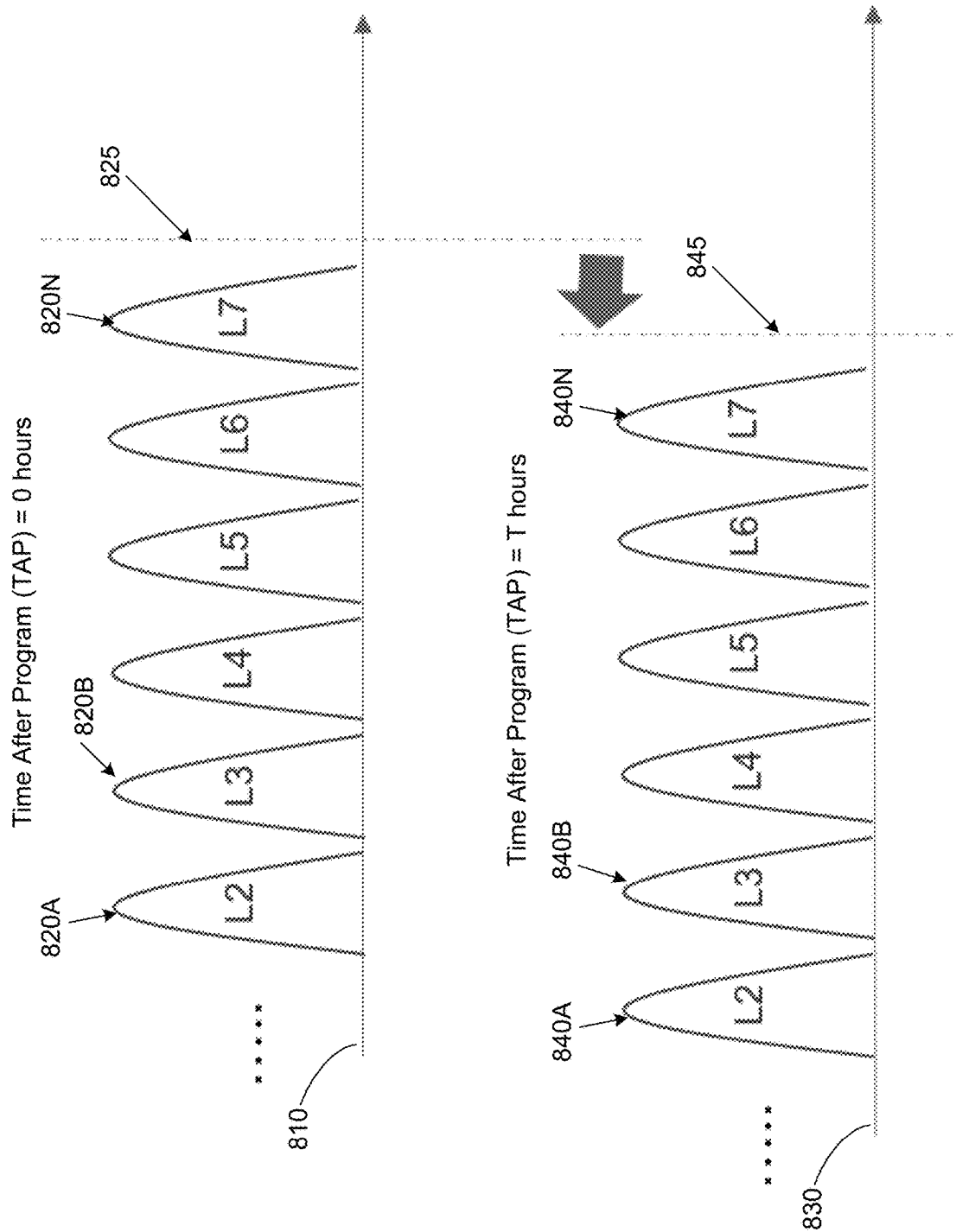

| VPASSR METADATA TABLE 910 | | |
|---|---|---|
| Bin | Offset Value | Counter Multiplier |
| 0 | 0 | 1 |
| 1 | $OV_1$ | 0.9 |
| 2 | $OV_2$ | 0.8 |
| 3 | $OV_3$ | 0.7 |
| 4 | $OV_4$ | 0.7 |
| 5 | $OV_5$ | 0.6 |
| ... | ... | ... |

| VPASSR METADATA TABLE 920 | | |
|---|---|---|
| Bin | VPASSR Setting | Counter Multiplier |
| 0 | High | 1 |
| 1 | High | 1 |
| 2 | Med | 0.8 |
| 3 | Med | 0.8 |
| 4 | Low | 0.6 |
| 5 | Low | 0.6 |
| ... | ... | ... |

FIG. 9A

| VPASSR METADATA TABLE 930 | | |
|---|---|---|
| TAP | Offset Value | Counter Multiplier |
| $t_0$ | 0 | 1 |
| $t_1$ | $OV_1$ | 0.9 |
| $t_2$ | $OV_2$ | 0.8 |
| $t_3$ | $OV_3$ | 0.7 |
| $t_4$ | $OV_4$ | 0.7 |
| $t_5$ | $OV_5$ | 0.6 |
| ... | ... | ... |

| VPASSR METADATA TABLE 940 | | |
|---|---|---|
| TAP | VPASSR Setting | Counter Multiplier |
| $t_0$ | High | 1 |
| $t_1$ | High | 1 |
| $t_2$ | Med | 0.8 |
| $t_3$ | Med | 0.8 |
| $t_4$ | Low | 0.6 |
| $t_5$ | Low | 0.6 |
| ... | ... | ... |

FIG. 9B

ADJUSTING PASS-THROUGH VOLTAGE BASED ON THRESHOLD VOLTAGE SHIFT

RELATED APPLICATION

This application a continuation of U.S. patent application Ser. No. 17/188,253, filed Mar. 1, 2021, the entire contents of which is hereby incorporated by reference herein.

TECHNICAL FIELD

Embodiments of the disclosure relate generally to memory sub-systems, and more specifically, relate to adjusting a pass-through voltage, the adjustment based on a threshold voltage shift.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 2 schematically illustrates the temporal voltage shift caused by the slow charge loss exhibited by triple-level memory cells, in accordance with some embodiments of the present disclosure.

FIG. 3 depicts an example voltage boundary table and an example voltage offset table.

FIG. 7 schematically illustrates example metadata maintained by the memory sub-system controller, in accordance with aspects of the present disclosure.

FIG. 8 schematically illustrates adjusting the pass-through voltage of a block of the memory device, in accordance with aspects of the present disclosure.

FIG. 9A schematically illustrates example metadata, maintained by the memory sub-system controller, of pass-through voltage settings based on bin, in accordance with aspects of the present disclosure.

FIG. 9B schematically illustrates example metadata, maintained by the memory sub-system controller, of pass-through voltage settings based on time after programming (TAP), in accordance with aspects of the present disclosure.

DETAILED DESCRIPTION

Figure 1:
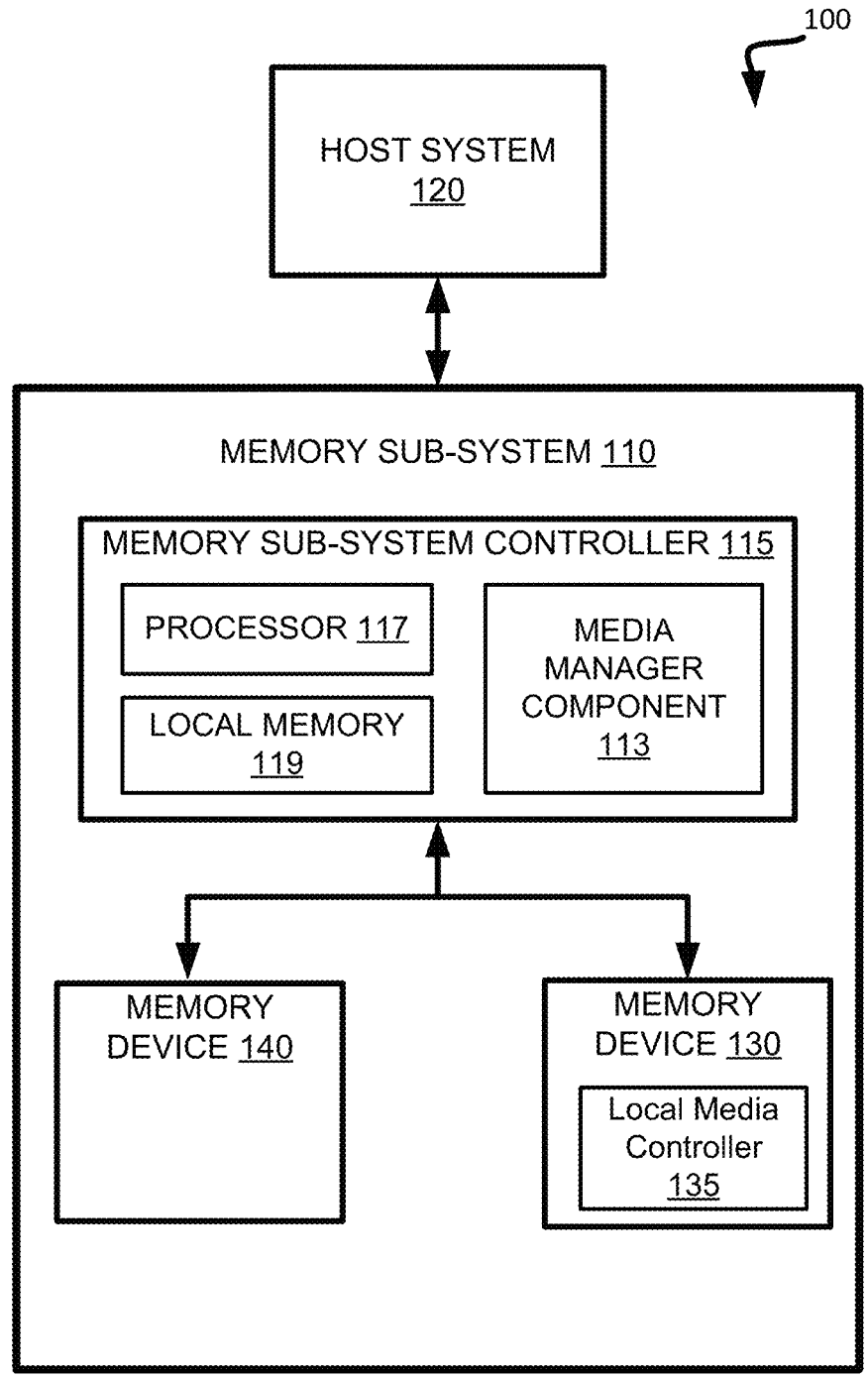
FIG. 1 illustrates an example computing system that includes a memory sub-system in accordance with some embodiments of the present disclosure.

Aspects of the present disclosure are directed to adjusting a pass-through voltage, the adjustment based on a threshold voltage shift. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. One example of a non-volatile memory device is a negative-and (NAND) memory device. Other examples of non-volatile memory devices are described below in conjunction with FIG. 1. In an illustrative example, a non-volatile memory device is a package of one or more dice, each including one or more planes. For some types of non-volatile memory devices (e.g., NAND memory), each plane includes of a set of physical blocks. Each block includes of a set of pages. "Block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values. Each block of the memory sub-system can be organized as a two-dimensional array of memory cells. Memory cells in the same row form a wordline and the transistors of memory cells in the same column (each memory cell from a different memory page) are bound together to form a bit line.

Various data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error correction code (ECC) parity data), data version (e.g. used to distinguish age of data written), valid bitmap (which LBAs or logical transfer units contain valid data), etc.

A memory device includes multiple memory cells capable of storing, depending on the memory cell type, one or more bits of information. A memory cell can be programmed (written to) by applying a certain voltage to the memory cell, which results in an electric charge being held by the memory cell, which is called as the "threshold voltage" and denoted as $V_T$ A high-quality memory device can have distributions that are narrow compared with the working range of control voltages tolerated by the cells of the device. Accordingly, multiple distributions (with "valleys" between distributions) can be fit into the working voltage window allowing storing and reliably detecting multiple bits per cell such as $2^3=8$ distributions (7 valleys) for TLC, $2^2=4$ distributions (3 valleys) for MLC etc. The distributions are interspersed with voltage intervals ("valley margins") between distributions where none (or very few) of the memory cells of the device have their threshold voltages. Such valley margins can, therefore, be used to separate various charge states—the logical state of the cell can be determined by detecting, during a read operation, by applying read voltages corresponding to each valley. This effectively allows a single memory cell to store multiple bits of information: a memory cell operated with $2^N$ distributions (which are also called levels) is capable of storing N bits of information. During the read operation, $2^{N-1}$ read voltages are applied to distinguish $2^N$ distributions. Specifically, the read operation can be performed by comparing the measured threshold voltage $V_T$ exhibited by the memory cell to one or more reference voltage levels corresponding to known valleys (e.g., centers of the valley) of the memory device.

Due to the phenomenon known as slow charge loss (SCL), the threshold voltage $V_T$ of a memory cell can change with time as the electric charge of the cell is diminishing, the process sometimes referred to as "temporal voltage shift" (TVS). "Storage charge loss" and "system charge loss" naming is also used for SCL. Since typical cells store negatively charged particles (electrons), the loss of electrons causes the voltage thresholds to shift along the voltage axis towards lower voltage thresholds $V_T$. The threshold voltages can change rapidly at first (immediately after the memory cell is programmed) while slowing down at larger times in an approximately log-linear or power-law fashion ($\Delta V_T(t)=-C^*t^b$) with respect to the time t elapsed since the cell programming event. In some embodiments of the present disclosure, TVS can be mitigated by keeping track of the time elapsed since the programming event as well as of the environmental conditions of a particular memory partition (block, plane, etc.) such as temperature and associating a voltage offset $\Delta V_T$ per valley to be used during read operations, where the standard "base read level" threshold voltage $V_T$ (displayed by the cell immediately after programing) is modified by the voltage offset: $V_T \rightarrow V_T + \Delta V_T$ where $\Delta V_T$ is negative due to charge loss. Whereas TVS is a continuous process and the compensating for $\Delta V_T(t)$ can be a continuous function of time, adequate accuracy of offsets can be achieved in some embodiments with a discrete number of offset "bins." "Families" of blocks (or any other memory partitions) programmed within a specified time window and/or under similar environmental (e.g., temperature) conditions can be associated with one of the threshold voltage offset bins. Given that wear-leveling keeps programmed at similar program-erase cycles (PECs), the time elapsed since programming and temperature conditions are among the main factors affecting the amount of TVS, different partitions within a single block family can be presumed to exhibit similar distributions of threshold voltages of their memory cells, and thus would require the same voltage offsets to be applied to the base read levels for read operations.

Block families can be created asynchronously with respect to block programming events. In an illustrative example, a new family can be created ("opened") whenever a specified period of time Δ t (e.g., a predetermined number of minutes) has elapsed since the creation of the last block family or whenever the reference temperature of memory cells has changed by more than a specified threshold temperature ΔΘ (e.g. 10 C, 20 C, or any other value). Similarly, the family can be "closed" (and a new family can be created) after the time Δt has elapsed since the family was created or if the reference temperature has changed (in either direction) by more than ΔΘ. A memory sub-system controller can maintain an identifier of the active block family, which is associated with one or more blocks as they are being programmed.

The memory sub-system controller can periodically perform a calibration process in order to associate partitions of various families with one of the bins. Each bin, in turn, can be associated with a set of the voltage offsets to be applied for read operations. The associations of partitions with families and families with bins is referred herein as auxiliary read metadata (ARM), which represent a part of broader state metrics of the memory device. The state metrics can also include the number of retired physical memory blocks (or other partitions), the number of times various physical blocks have been erased, types of configurations of cells of various memory partitions (e.g., single-level cell vs. multi-level cells), or any other type of information representative of the state of the memory device. The ARM can be stored in metadata tables maintained by the memory sub-system controller.

In accordance with embodiments of the present disclosure, the TVS can be selectively tracked for programmed partitions that are grouped into families. Based on the groupings of partitions into families, appropriate bin-specific read (voltage) offsets are applied to the base read (voltage) levels in read operations. Base read levels can also be stored in the metadata of the memory device. Upon receiving a read command, the memory sub-system controller can (1) identify the family associated with the memory partition identified by the logical address specified in the read command, (2) identify the current bin associated with the identified family, (3) determine a set of read offsets for the identified bin, (4) compute the new read voltages by additively applying the read offsets associated with the identified bin to the base read levels, and (5) perform the read operation using the new read voltage, as described in more detail below.

During a read operation, a read reference voltage is applied to a selected wordline containing the data to be read, while a pass-through voltage is applied to unselected wordlines of unread memory cells to ensure that the cells on those wordlines are turned on during the read operation. Only one memory cell is read at a time per bit line. The pass-through voltage is a read reference voltage higher than any of the stored threshold voltages, i.e., Vt. However, when data is read from a wordline which is composed of the memory cells of the memory sub-system, other wordlines on the same block can experience what is known as read disturb due to the pass-through voltage applied on these un-selected wordlines. Read disturb is a phenomenon in NAND memory where reading data from a wordline which is composed of the memory cells can cause the threshold voltage of unread memory cells on un-selected wordlines in the same block to shift to a higher value. In particular, the high pass-through voltage induces electric tunneling that can shift the threshold voltages of unread cells to higher values, which is quite problematic especially for levels with smaller Vt such as erase distribution. Each threshold voltage shift can be small, but these shifts can accumulate over time and become large enough to alter the state of some memory cell, which can cause read disturb errors. Read disturb is the result of continually reading from one wordline without intervening erase operations, causing other memory cells in nearby wordlines to change over time. If too many read operations are performed on a wordline, data stored at adjacent wordlines of the memory sub-system can become corrupted or incorrectly stored at the memory cell(s). This can result in a higher error rate of the data stored at these un-selected wordlines. When a read operation is performed on one of the un-selected wordlines that experienced read disturb, the read can fail due to the high error rate caused by read disturb and this triggers the use of error control operations (i.e., error handling operations) to recover the data. The increased use of the error control operation can result in a reduction of the performance of the conventional memory sub-system. As more resources of the memory sub-system are used to perform the error control operation, fewer resources can be used to perform other read operations or write operations.

In some implementations, the pass-through voltage remains the same throughout the lifetime of the memory sub-system. For example, the pass-through voltage can be set to a predetermined voltage higher than the highest threshold voltage of a memory cell. If the pass-through voltage is too low, then the pass-through voltage can fail to turn on unselected wordlines (thus causing sensing issues), while the higher the pass-through voltage, the greater the resulting read disturb. However, as voltage distributions in memory cells shift along the voltage axis towards lower voltage levels, the memory cells do not need to maintain their original high pass-through voltage, which contributes to read disturb. In particular, lowering the pass-through voltage in response to the voltage distributions shifting in the memory cells can still ensure that other wordlines are turned on during the read operation, while mitigating the effects of read disturb.

Aspects of the present disclosure address the above and other deficiencies by implementing a memory sub-system controller capable of adjusting a pass-through voltage according to the threshold voltage shift. In an illustrative example, the memory sub-system can receive a read command to perform a read operation on a block of the memory device. The memory sub-system controller can then determine a pass-through voltage for the block using a metadata table. In some embodiments, the metadata table can include a listing of pre-computed pass-through voltages that correspond to each predefined threshold voltage offset bin used by the memory sub-system (which is associated with the voltage offset to be applied for read operations), or to a TAP value and/or temperature history of the block exceeding a threshold criterion, where each threshold criterion corresponds to a pre-computed pass-through voltage. The memory sub-system controller can then perform the read operation by applying a read reference voltage to a selected wordline of the block and applying the determined pass-through voltage to the unselected wordlines of the block.

In another example, the memory sub-system controller can use a metadata table to select a pass-through voltage offset value to apply to the base pass-through voltage (e.g., the initial pass-through voltage) to determine the pass-through voltage. For example, the metadata table can include a listing of precomputed pass-through offset voltages that correspond to each predefined threshold voltage offset bin used by the memory sub-system, or to each TAP value and/or temperature history threshold criterion. Based on the metadata table, the memory sub-system controller can then subtract the pass-through offset voltage from the base pass-through voltage to determine the pass-through voltage to be applied during the read operation.

Advantages of the present disclosure include, but are not limited to, an improved performance of the memory sub-system by mitigating read disturb by reducing the pass-through voltage used during read operations performed by the memory sub-system. This can result in an improvement of performance of the memory sub-system due to less frequent trigger of error control operations as well as the lower probability of refreshing a block due to high read disturb and a decrease in power consumption by the memory sub-system. Furthermore, this can increase the lifespan of the memory sub-system. Although embodiments are described using memory cells of a NAND flash memory, aspects of the present disclosure can be applied to other types of memory sub-systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In one embodiment, the memory sub-system 110 includes a media manager component 113 that can be used to track and manage data and adjust the pass-through voltage in the memory device 130 and the memory device 140. In some embodiments, the memory sub-system controller 115 includes at least a portion of the media manager component 113. In some embodiments, the media manager component 113 is part of the host system 120, an application, or an operating system. In other embodiments, local media controller 135 includes at least a portion of media manager component 113 and is configured to perform the functionality described herein. The media manager component 113 can communicate directly with the memory devices 130 and 140 via a synchronous interface. Furthermore, transfers of data between the memory device 130 and the memory device 140 can be done within the memory sub-system 110 without accessing the host system 120. Further details with regards to the operations of the media manager component 113 are described below.

FIG. 2 schematically illustrates the data degradation (e.g., temporal voltage shift) caused by the slow charge loss exhibited by triple-level memory cells. While the illustrative example of FIG. 2 utilizes triple-level cells, the same observations can be made and, accordingly, the same remedial measures are applicable to single level cells and multi-level cells in order to compensate for the slow charge loss.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of charts 210 and 230 illustrates program distributions 220A-220N (e.g., voltage distributions) of memory cells programmed by a respective write level (which can be assumed to be at the midpoint of the program distribution) to encode a corresponding logical level ("000" through "111" in case of a TLC). The program distributions 220A through 220N can illustrate the range of threshold voltages (e.g., normal distribution of threshold voltages) for memory cells programmed at respective write levels (e.g., program voltages). As shown, a triple-level memory cell can have seven program distribution valleys (e.g., valley 1 (210A), valley 2 (210B) . . . valley 7 (210N)). In order to distinguish between adjacent distributions (corresponding to two different logical levels), the read threshold voltage levels (shown by dashed vertical lines) are defined, such that any measured voltage that falls below a read threshold level is associated with one distribution of the pair of adjacent program distributions, while any measured voltage that is greater than or equal to the read threshold level is associated with another distribution of the pair of neighboring distributions.

In chart 210, eight states of the memory cell are shown below corresponding program distributions (except for the state labeled ER, which is an erased state, for which a distribution is not shown). Each state corresponds to a logical level. The threshold voltage levels are labeled Va-Vh. As shown, any measured voltage below Va is associated with the ER state. The states labeled P1, P2, P3, P4, P5, P6, and P7 correspond to distributions 22A-220N, respectively.

Time After Program (TAP) herein shall refer to the time elapsed since a cell has been programmed. The TAP is the primary driver of TVS (temporal voltage shift) along with temperature. The TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice can be referenced by its center point (e.g., 10 minutes). In various embodiments of the present disclosure, metrics associated with each of the program distribution valleys can be measured and used to determine whether to refresh the block by performing a media management operation (e.g., a folding operation).

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages needs to be adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

FIG. 3 depicts an example voltage boundary table and an example voltage offset table. The voltage boundary table 310 and the voltage offset table 320 can be used to determine read level offsets, which are added to a base read level voltage to read data from memory cells. As the time after program increases, the threshold voltages for the distribution of the memory cell can change as a result of slow charge loss, as illustrated in the example of FIG. 2. To determine the appropriate read level offset for reading a cell, a measurement of the cell can be performed to estimate the time after program of the cell based on data state metrics such as voltages. For example, the valley 7 read position corresponding to Vg in FIG. 2 (between valleys P6 and P7) can be measured, and the difference between the measured read level (e.g., 100 millivolts) and a reference read level (e.g., 0 volts) can be determined. The difference corresponds to the time after program of the memory cell, and can be used to identify a read level offset to add to the base read threshold level to perform read operations. Determination of the read offsets to be used for the read operation is not done during the read operation and bin for each block grouping (in terms of block families) needs to be ahead of time with foreground/background operations so that when a read request is received the bin the read associates with is available in meta data tables.

The voltage boundary table 310 can be used to identify a bin that contains read offsets for use in reading data from the memory cell. The bin to be used is the value of the Bin column for which the voltage difference (between the measured read level and the reference read level) corresponds to a voltage range shown in the Boundaries column. For example, if the difference is less than V1, then bin 0 is to be used. If the difference is between V1 and V2, then bin 1 is to be used, and so on. The voltage offsets table can be used to identify the read level offsets to be used for the identified bin. For example, if the bin to be used is bin 0, then the corresponding one of the offsets shown in the column labeled "Bin 0" 322 (e.g., V10, V20, ... V60) is to be added to the base read offset level (and any other offsets) for each of valleys 1-7 when reading the memory cell. "Bin 0" 322 corresponds to the time after program of 0 hours shown in FIG. 2 where SCL is very low. A column "Bin 5" 324 corresponds to the time after program of T hours shown in FIG. 2 where SCL is higher, and has offsets of greater magnitude. Bin numbers less than a threshold age value can be referred to as "younger bins" and bin numbers greater than or equal to the threshold age value can be referred to as "older bins." For example, if the threshold age value is the bin number 5, then bins 0-4 can be referred to as younger bins, and bins 5-7 can be referred to as older bins. As another example, if the threshold age value is the bin number 4, then bins 0-3 can be referred to as younger bins, and bins 4-7 can be referred to as older bins. Identification of the bin each block family is associated with predetermined cadence using foreground and/or background operations. Even though determination of bin here is described by doing measurements on valley-7 for (TLC), other measurement-based approaches can also be used to determine the bin information such as measuring the mean of valley(s) and/or left and/or right edges of valley(s). Furthermore, the bin information can be determined by performing a read operation on a subset of blocks and/or pages in the block family using all or a subset of available voltage offsets and then assigning the block family (or the block group) the bin that results the lowest RBER.

As described above, "read level" herein shall refer to a voltage position. Read levels are numbered in increasing voltage from L1 through 2^(number of bits). As an example, for TLC, the read levels would be L1, L2, ..., L7. "Read level value" herein shall refer to a voltage or DAC value representing a voltage that is applied to the read element (often, the control gate for a NAND cell) for purposes of reading that cell. "Read level offset" herein shall refer to a component of the equation that determines the read level value. Offsets can be summed (i.e., read level value=offset_a+offset_b+ ... ). By convention, one of the read level offsets can be called the read level base. "Calibration" herein shall refer to altering a read level value (possibly by adjusting a read level offset or read level base) to better match the ideal read levels for a read or set of reads. "Altering the read level value" can include determining the bin for the block family and the offset value comes from the particular bin.

As described above, "bin" herein shall refer to a set of read level offsets that are applied to a set of data. The bin offsets are read level offsets that affect the read level for block families associated with the bin. In this context, a bin is usually primarily directed at addressing TVS, but can also be directed at other mechanisms (e.g., temperature coefficient (tempco) miscalibration). An old or older bin is one where the read level offsets are directed at data that was written at a relatively early time. A young or younger bin is one where the read level offsets are directed at data written relatively recently. The read level adjustments can be implemented through either offsets or read retries, or even as an adjustment to the base. Bin selection herein shall refer to the process by which the memory device selects which bin to use for a given read.

Figure 4A:
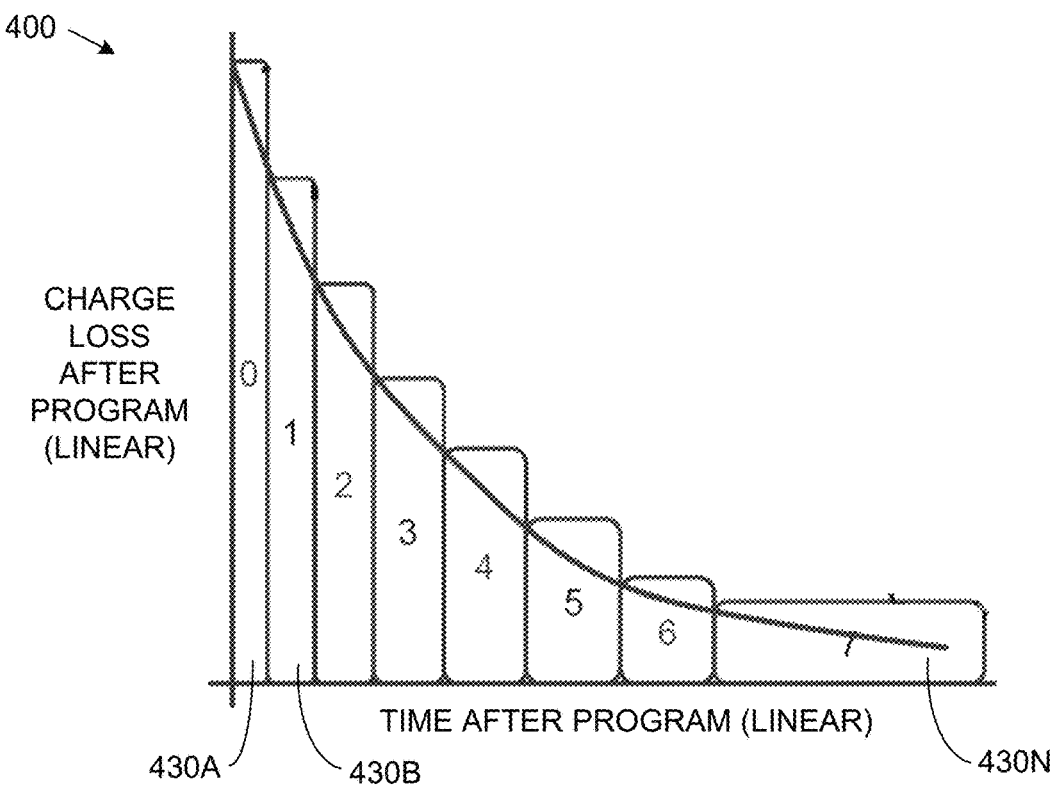
FIG. 4A depicts an example graph illustrating the dependency of the threshold voltage offset on the time after program (i.e., the period of time elapsed since the block has been programmed, in accordance with some embodiments of the present disclosure.

FIG. 4A depicts an example graph 400 illustrating the dependency of the threshold voltage offset on the time after program (i.e., the period of time elapsed since the block has been programmed, in accordance with some embodiments of the present disclosure. As schematically illustrated by FIG. 4A, blocks families of the memory device are grouped into bins 430A-430N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family—are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family. The memory sub-system controller can maintain an identifier of the active block family, which is associated with one or more blocks as they are being programmed.

A newly created block family can be associated with bin 0. Then, the memory sub-system controller can periodically perform a calibration process in order to associate each die of every block family with one of the predefined voltage bins (bins 0-7 in the illustrative example of FIG. 4A), which is in turn associated with the voltage offset to be applied for read operations. The associations of blocks with block families and block families and dice with voltage bins can be stored in respective metadata tables maintained by the memory sub-system controller, such as metadata tables described with respect to FIG. 7 below.

Figure 4B:
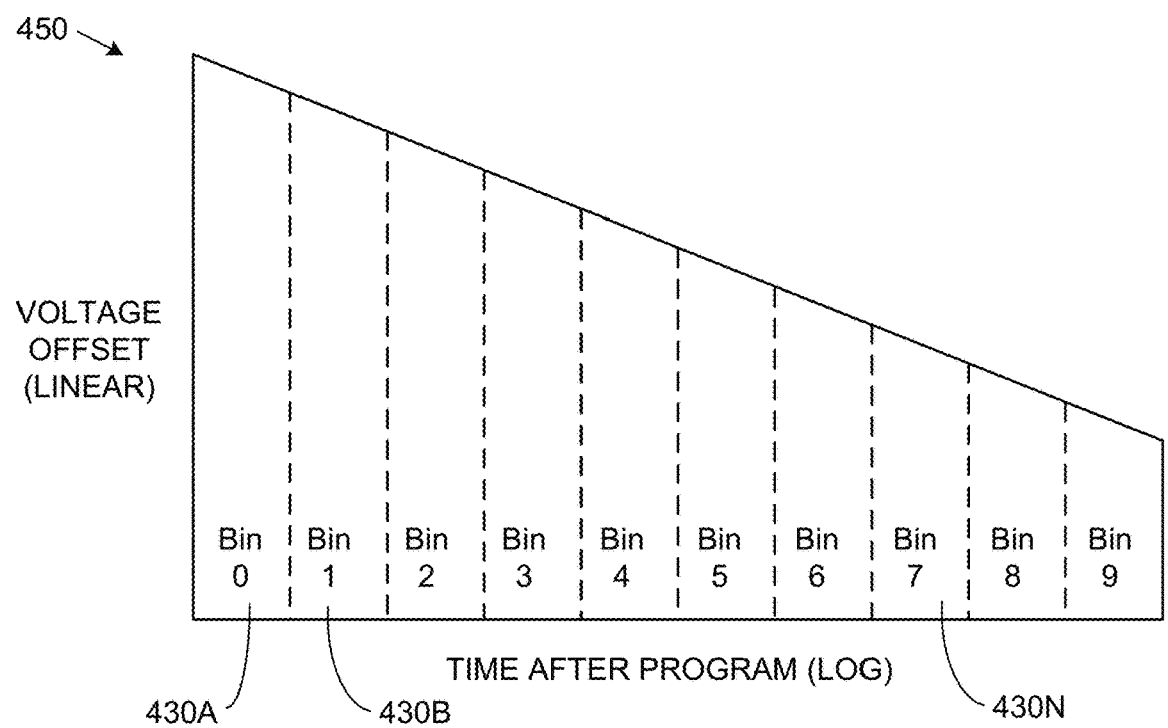
FIG. 4B schematically illustrates a set of predefined voltage bins, in accordance with embodiments of the present disclosure.

FIG. 4B schematically illustrates a set of predefined threshold voltage bins, in accordance with embodiments of the present disclosure. As schematically illustrated by FIG. 4B, the threshold voltage offset graph 450 can be subdivided into multiple voltage bins, such that each voltage bin corresponds to a predetermined range of threshold voltage offsets. While the illustrative example of FIG. 4B defines ten voltage bins for a single valley, in other implementations, various other numbers of voltage bins can be employed (e.g., 64 bins). The memory sub-system controller can associate each die of every block family with a voltage bin, based on a periodically performed calibration process, described in further detail below. In FIG. 4B, offsets for bin-1 (430B) has lower magnitude compared to offsets for bin-7 (430N). If negative offsets are used, then the offsets are added to the base read thresholds, whereas if positive offsets are used, then the offsets are subtracted from the base read thresholds. FIG. 4B shows negative offsets along the y-axis.

Figure 5:
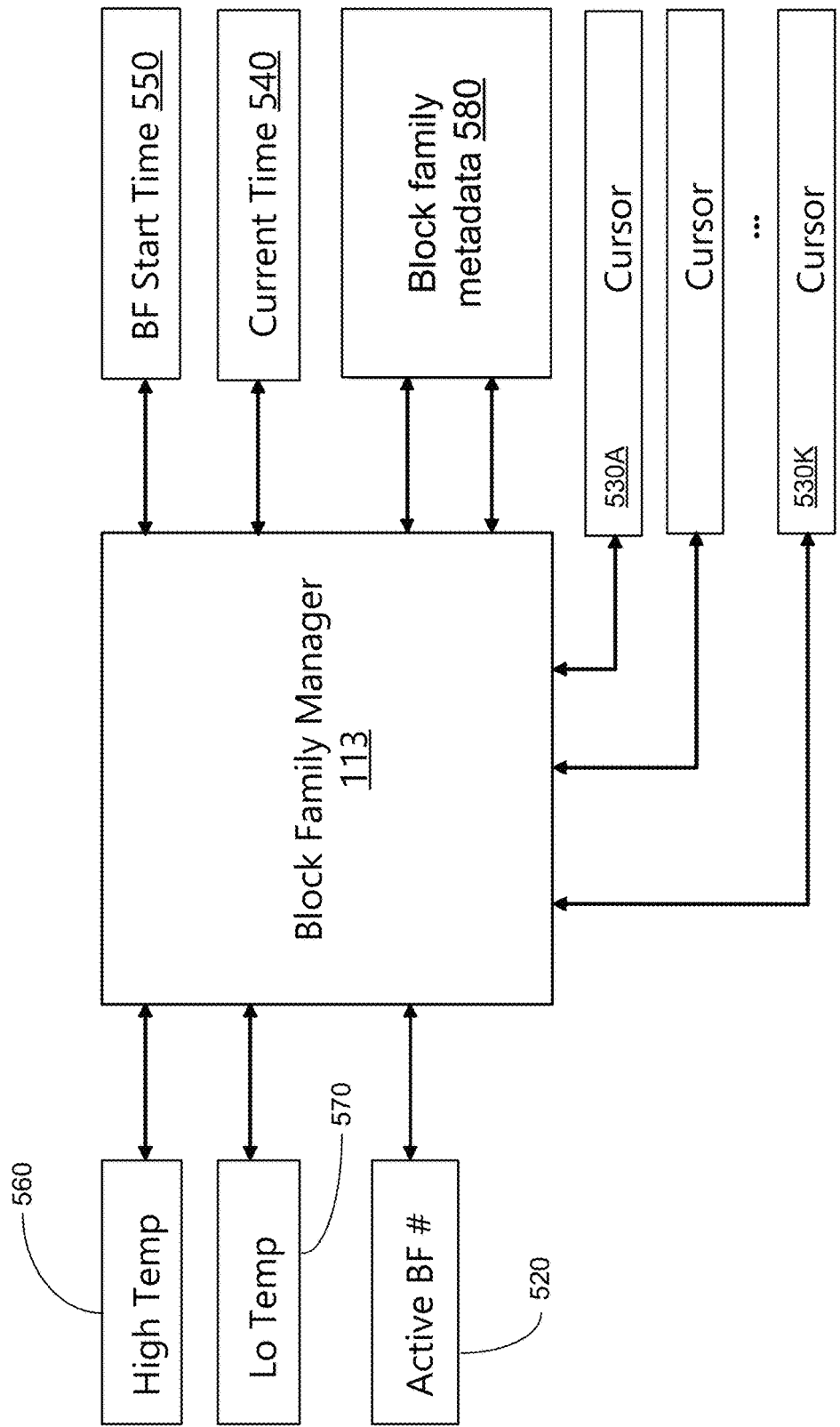
FIG. 5 schematically illustrates block family management operations implemented by a block family manager component, in accordance with embodiments of the present disclosure.

FIG. 5 schematically illustrates block family management operations implemented by the media manager component 113 of the memory sub-system controller 115, in accordance with embodiments of the present disclosure. As schematically illustrated by FIG. 5, the media manager component 113 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, media manager component 113 stores the current time 540 in a memory variable as the block family start time 550. As the blocks are programmed, media manager component 113 compares the current time 540 to the block family start time 550. Responsive to detecting that the difference of the current time 540 and the block family start time 550 is greater than or equal to the specified time period (e.g., a predetermined number of minutes), media manager component 113 updates the memory variable storing the active block family identifier 520 to store the next block family number (e.g., the next sequential integer number), and the memory variable storing the block family start time 550 is updated to store the current time 540.

The block family manager 510 also maintains two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can close the existing block family and can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a block, media manager component 113 associates the block with the currently active block family. The association of each block with a corresponding block family is reflected by the block family metadata 710, as described in more detail herein below with reference to FIG. 7.

As described previously, based on a periodically performed calibration process (calibration scan), media manager component 113 associates each die of every block family with a voltage bin, which defines a set of threshold voltage offsets to be applied to the base voltage read level in order to perform read operations. The calibration process involves performing, with respect to a specified number of randomly selected blocks within the block family that is being calibrated, read operations utilizing different threshold voltage offsets, and choosing the threshold voltage offset that minimizes the error rate of the read operation. media manager component 113 determines the particular voltage bin corresponding to the chosen threshold voltage offset and updates metadata for the block family to correspond to the determined voltage bin. As described in 0057 instead of doing read operations, calibration process can also use different measurements on one or more levels and/or valleys.

Figure 6:
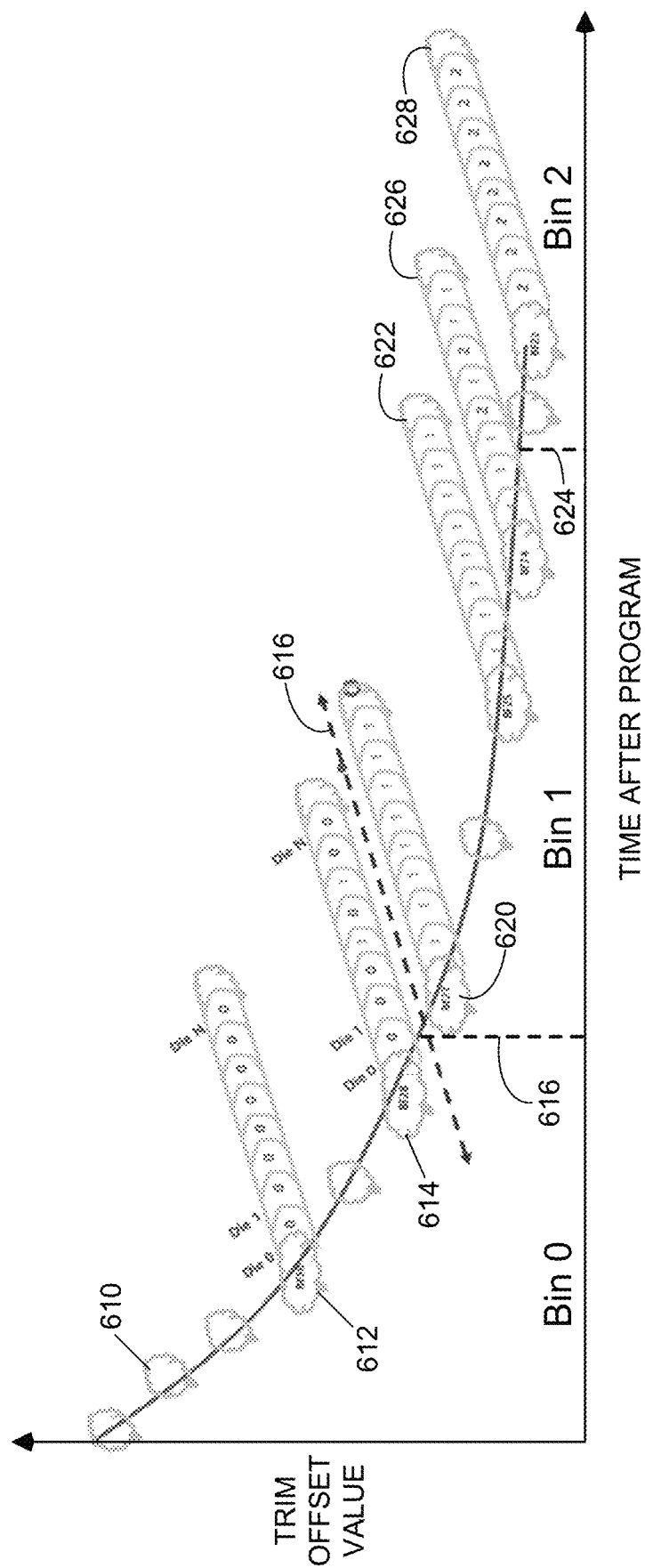
FIG. 6 schematically illustrates selecting block families for calibration, in accordance with embodiments of the present disclosure.

In some embodiments, the frequency at which the memory sub-system controller performs the calibration process for each voltage bin can be based on an age of the block families associated with the voltage bin. As described previously with respect to FIG. 4A, newly created block families can be associated with voltage bin 0 and older block families on the memory device can be associated with subsequently numbered voltage bins. The temporal voltage shift for block families in a younger voltage bin is more significant than the temporal voltage shift for block families associated with an older voltage bin. Therefore, the memory sub-system controller can perform the calibration process for block families associated with voltage bin 0 at a higher frequency than for block families associated with voltage bin 9 to associate each block family with an appropriate voltage bin. [0073] FIG. 6 schematically illustrates selecting block families for calibration, in accordance with embodiments of the present disclosure. Three bins are shown, named bin 0, bin 1, and bin 2. Bin 0 includes block families 610, 612, and 614. Bin 1 includes block families 620, 622, and 626. Bin 2 includes block family 628. Due to slow charge loss, the oldest block families in a voltage bin will migrate to the next voltage bin before any other block families of the current bin. As such, the memory sub-system controller can limit calibration operations to the oldest block families in a bin (e.g., block family 614 in bin 0 and block family 626 in bin 1). In some embodiments, the memory sub-system controller can identify the oldest block family in a voltage bin based on a bin boundary 616 for the bin. A bin boundary 616 can represent a boundary between two adjacent block families that are each associated with a different bin. The memory sub-system controller can identify the bin boundary 616 for a particular voltage bin using a block family metadata table, described in further detail below. The bin boundary 616 is between bins 0 and 1. A second bin boundary 624 is between bins 1 and 2.

FIG. 7 schematically illustrates example metadata maintained by the memory sub-system controller, in accordance with aspects of the present disclosure. In some embodiments, media manager component 113 can maintain a block metadata table 710 and a block family metadata table 720. In some embodiments, block metadata table 710 and/or block family metadata table 720 can be stored in memory of the memory sub-system (e.g., at memory device 130, 140, local memory 119, etc.) and can be referenced by media manager component 113 to determine a block family associated with a particular block and/or a voltage bin associated with the block family. As illustrated in FIG. 7, block metadata table 710 and block family metadata table 720 can be separate metadata tables. In other or similar embodiments, block metadata table 710 and block family metadata table 720 can be included in a single metadata table. Additionally or alternatively, block metadata table 710 and block family metadata table 720 can be included in other metadata tables maintained by media manager component 113, such as a superblock table, an offset table, etc.

In some embodiments, the block metadata table 710 can be indexed by block family and each entry of the block metadata table 710 can include an indication of one or more blocks, spanning one or more die, included in a block family. As illustrated in FIG. 7, block metadata table 710 is indexed by block family and includes an indication of a range of blocks included in each block family. In other or similar embodiments, the block metadata table 710 can be indexed by block and each entry can include an indication of the block family associated with the block. Each entry of block metadata table 710 can also include additional data corresponding to each block. For example, each entry of block metadata table 710 can include an indication of a time (e.g., in hours), when the block was written to the memory device. Additionally or alternatively, each entry can include an indication of a temperature (e.g., in Celsius) when the block was written to the memory device.

Block family table 720 is indexed by the block family number, such that each record of the block family table 720 specifies, for the block family referenced by the index of record, a set of voltage bins associated with respective dice of the block family. In other words, each record of the block family table 720 includes a vector, each element of which specifies the voltage bin associated with the die referenced by the index of the vector element (referred to as a bin pointer). Although individual dice of a block family can be associated with different voltage bins, the block family itself is associated with a particular voltage bin. The media manager component 113 determines the voltage bin associated with a particular block family based on the bin pointer having the lowest value included in the vector for the block family. In an illustrative example, the lowest bin pointer value of the vector for block family 60 is associated with voltage bin 0 (i.e., for die 1). Therefore, media manager component 113 associates block family 60 with voltage bin 0. Similarly, block families 61-64 are associated with voltage bin 0 (because the lowest bin pointer value in each of blocks 61-64 is 0), block family 59 is associated with bin 1, block family 5 is associated with bin 6, and block families 0-4 are associated with bin 7. As an example, in response to receiving a request to read data included in block family 60, media manager component 113 uses the threshold voltage associated with voltage bin 0.

A "Bin 0" label 730 is shown next to block families 60-64 to illustrate that block families 60-64 are associated with ("in") Bin 0, a "Bin 1" label 731 is shown next to block family 59 to illustrate that block family 59 is in bin 1, a "Bin 6" label 736 is shown next to block family 5 to illustrate that block family 5 is in bin 6, and a "Bin 7" label 737 is shown next to block families 0-4 to illustrate that block families 0-4 are in bin 7.

A bin boundary can represent a boundary between two adjacent block families that are each associated with a different voltage bin. Therefore, media manager component 113 can identify a bin boundary for a voltage bin based on the bin pointers of the vector included in each record of the block family table 720. Media manager component 113 can identify a voltage bin boundary for a particular voltage bin by identifying the oldest block family (i.e., the block family least recently created) associated with a vector including bin pointers for one or more die that correspond to the particular voltage bin. As illustrated in FIG. 7, the vectors for block families 60-64 include a bin pointer associated with voltage bin 0. media manager component 113 can associate block family 60 with a bin boundary 722 for voltage bin 0, as block family 60 is the oldest block family of block family table 720 where the bin pointer for die 1 corresponds to voltage bin 0. Media manager component 113 can associate block family 5 with bin boundary 724 for voltage bin 6, in accordance with previously described embodiments.

As time passes and time after program increases for a particular die, the threshold voltage levels associated with the die can change, and the die can be re-assigned to an "older" bin that has a threshold voltage level suitable for the time after program or SCL associated with that die. Media manager component 113 can perform a calibration scan (i.e., calibration process described earlier) to update the bin pointers of each block families so that the bin pointer of each die points to the bin that correspond to the time after program of that die. Thus, the bin numbers can increase from the newest bin (e.g., 0) to the oldest bin (e.g., bin 7) over time as a result of the calibration scan. The calibration scan can be performed for a particular voltage bin by identifying, using block family table 720, an oldest block family associated with the voltage bin (i.e., the block family associated with the bin boundary). In some embodiments, media manager component 113 can perform the calibration scan for a predefined number of block families associated with the voltage bin (e.g., 2 oldest block families for each calibration scan). In such embodiments, block family manager component 113 can select, using block family table 720, the two oldest block families (e.g., block family 60 and block family 61) associated with the voltage bin. In response to selecting the predefined number of block families, media manager component 113 can perform the calibration scan, in accordance with embodiments described herein.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the block table 710 is used to identify the block family identifier corresponding to the physical block number; then, the block family identifier is used as the index to the family table 720 in order to determine the voltage bin associated with the block family and the die; finally, the identified voltage bin is used as the index to an offset table (such as 320 in FIG. 3) in order to determine the threshold voltage offset corresponding to the bin. The memory sub-system controller can then apply the identified threshold voltage offset to the base voltage read level in order to perform the requested read operation. If negative offsets are used, then offsets are added to the base voltage read levels, whereas if positive read offsets are used, then offsets are subtracted from the based voltage read levels.

FIG. 8 schematically illustrates adjusting the pass-through voltage of a block of the memory device. The media manager component 113 can perform a read operation to retrieve data from one or more pages stored at a particular location of memory device 130, 140. Each of the pages may be accessed by a wordline and a bit line of the memory device 130, 140. For example, the media manager component 113 may provide a voltage input at a particular wordline and at a particular bitline to retrieve data stored at a corresponding memory page of the memory device 130, 140. More specifically, during the read operation, a read reference voltage is applied to the wordline containing the data to be read, while a pass-through voltage is applied to wordlines of unread memory cells to ensure that those wordlines are turned-on during the read operation. For example, the memory sub-system controller 115 can perform the read operation by comparing the measured voltage exhibited by memory cell(s) of the wordline to one or more read reference voltage levels in order to distinguish between two logical levels for single-level cells and between multiple logical levels for multi-level cells. In some embodiments, a read level offset may be applied to the read reference voltage to compensate for slow charge loss, read disturb, etc. For example, the voltage boundary table 310 and the voltage offset table 320 of FIG. 3 can be used to determine read level offsets, which are added to a base read level voltage to read data from memory cells. The pass-through voltage is a read reference voltage higher than the highest stored threshold voltage (e.g., the level 7 distribution of a triple-level cell, 220N or P7 in FIG. 2) of the memory cells in the block.

Graphs 810 and 830 illustrate programing distributions 820A-820N and 840A-840N, respectively, of memory cells programmed by a respective write level. The memory sub-system controller sets a base pass-through voltage 825 at TAP=0 hours, which is a voltage higher than program distribution valley 820N. Base pass-through voltage 825 can be set immediately after the block is programmed (e.g., written to). As the program distributions change over time due to slow charge loss and/or read disturb, the media manager component 113 can set a new pass-through voltage, as shown by pass-through voltage 845, in response to a reference voltage calibration event. The reference voltage calibration event can include a block family being assigned to a new predefined threshold voltage offset bin, a TAP value exceeding a predetermined threshold, etc. In one example, the media manager component 113 can select the new pass-through voltage 845 using a metadata table that indicates the new pass-through voltage as a function of the reference voltage calibration event. In another example, the media manager component 113 can determine the new pass-through voltage by applying a pass-through voltage offset value to the base pass-through voltage 825. The offset value may be retrieved using a metadata table that indicates the pass-through offset voltages as a function of the reference voltage calibration event.

FIG. 9A schematically illustrates example metadata tables, maintained by the memory sub-system controller, of pass-through voltage settings based on predefined threshold voltage offset bins, in accordance with aspects of the present disclosure. In a first example, as illustrated by VPASSR metadata table 910, each bin can be assigned a pass-through voltage offset value. The pass-through voltage offset value can then be used by the media manager component 113 in order to adjust the pass-through voltage by subtracting the offset value from the base pass-through voltage to determine the new pass-through voltage. The media manager component 113 can initialize the base pass-through voltage at TAP=0 to a predetermined value. In an example, the pass-through voltage for blocks in block families assigned to bin 0 is the base pass-through voltage. In another example, the pass-through voltage for blocks in block families assigned to bin 0 can be offset by an offset value. The pass-through voltage for blocks in block families assigned to bin 1 is offset, by media manager component 113, by offset value 1 ($OV_1$) from the base pass-through voltage, the pass-through voltage for blocks in block families assigned to bin 2 is offset, by media manager component 113, by offset value 1 ($OV_2$) from the base pass-through voltage, etc. In some embodiment, each offset value (e.g., $OV_1$-$OV_5$) can be a precomputed voltage value (measured in millivolts, DACs, etc.) set during manufacturing or programming of the memory sub-system 110. In other embodiments, each offset value can be adjusted or set by an operator of the memory sub-system 110.

In an illustrative example, the media manager component 113 can assign a block family to bin 0 and use the base pass-through voltage. In response to the media manager component 113 assigning the block family to bin 1 to adjust the read threshold voltages (thereby compensating for the shift in program distributions), the media manager component 113 can then, using VPASSR metadata table 910, set a new pass-through voltage for the blocks in the block family by offsetting the base pass-through voltage by $OV_1$.

In another example, as illustrated by VPASSR metadata table 920, each bin can be assigned a VPASSR setting (e.g., bins 0 and 1 are assigned a "high" VPASSR setting, bins 2 and 3 are assigned a "medium" VPASSR setting, bins 4 and 5 are assigned a "low" VPASSR setting). Each VPASSR setting (e.g., high VPASSR setting, medium VPASSR setting, low VPASSR setting) can correspond to a pass-through voltage. For example, the high VPASSR setting can correspond to the base pass-through voltage, the medium VPASSR setting can correspond a pass-through voltage lower than the high VPASSR setting, and the low VPASSR setting can correspond to a pass-through voltage lower than both the high VPASSR setting and the medium VPASSR setting. The pass-through voltage for blocks in a block family can be set to the value of the VPASSR setting associated with the bin the block family is assigned to. For example, a block family can be assigned to bin 0 and use the pass-through voltage identified by the high VPASSR setting (e.g., the base pass-through voltage). The block family can then be assigned to bin 2 to adjust the read threshold voltages. The media manager component 113 can then, using VPASSR metadata table 920, set the pass-through voltage for the blocks in the block family to the pass-through voltage identified by the medium setting. It is noted that the VPASSR settings are for illustrative purposes only, and that any amount of VPASSR settings can be used.

FIG. 9B schematically illustrates example metadata tables, maintained by the memory sub-system controller, and of pass-through voltage settings based on TAP, in accordance with aspects of the present disclosure. In a first example, as illustrated by VPASSR metadata table 930, each TAP threshold value (e.g., $t_0$, $t_1$, etc.,) can be assigned a corresponding offset value ($OV_1$, $OV_2$ ... $OV_5$). The media manager component 113 can track the time after programming for each block or block family. Once the TAP exceeds a TAP threshold value, the media manager component 113 can determine a new pass-through voltage of the block or block family based on the offset value identified in VPASSR metadata table 930 by the exceeded TAP threshold value. For example, in response to the TAP value exceeding TAP threshold $T_2$, the media manager component 113 can offset the base pass-through threshold value by $OV_2$.

In another example, as illustrated by VPASSR metadata table 940, each TAP threshold value can be assigned a VPASSR setting (e.g., TAP thresholds $t_0$ and $t_1$ are assigned the "high" VPASSR setting, $t_2$ and $t_3$ are assigned the "medium" VPASSR setting, $t_4$ and $t_5$ are assigned the "low" VPASSR setting). Each VPASSR setting can correspond to a pass-through voltage value (e.g., the high setting can correspond to the base pass-through voltage, the medium VPASSR setting can correspond a pass-through voltage lower than the high VPASSR setting, and the low VPASSR setting can correspond to a pass-through voltage lower than both the high VPASSR setting and the medium VPASSR setting. The media manager component 113 can track the time after programming for each block or block family. Once the TAP exceeds a TAP threshold value, the pass-through voltage for blocks in a block family can be set to the value of the VPASSR setting identified with the bin the block family is assigned to. For example in response to the TAP value exceeding TAP threshold $T_2$, the media manager component 113 can set the pass-through voltage, using VPASSR metadata table 940, for the blocks in the block family from the value identified by the high VPASSR setting to the value identified by the medium setting.

In an illustrative example, a read operation performed with an adjusted pass-through voltage can result in a read error. In response, the media manager component 113 can reset the pass-through voltage value to the base pass-through voltage value that was assigned immediately after the block(s) was programmed (e.g., the "high" VPASSR setting) or remove any assigned pass-through voltage offset values. This ensures that the error handling flow is not affected by unselected wordlines' inability to be turned on by a pass-through voltage that is too low. In particular, lowering the pass-through voltage creates the risk that the pass-through voltage becomes low enough to turn on an unselected wordline, thereby reading data on the unselected wordline and generating a read error. For example, the error correction operation can be an error-correcting code (ECC) operation or another type of error detection and correction operation to detect and correct an error.

As the value of the pass-through threshold is adjusted to lower values, the effects associated with read disturb can be decreased. Accordingly, in some embodiments, the media manager component 113 can adjust a read operation counter related to media management operations (e.g., folding operations) based on the pass-through voltage value. In particular, the media manager component 113 can track read operations using a read operation counter. Each read operation performed on a block of the memory device 130, 140 can increment a read operation counter value by 1 for that block. Responsive to the read operation counter value satisfying a scan threshold criterion (e.g., exceeding 10,000 read operations, 100,000 read operations, etc.), the media manager component 113 can trigger a media management operation (e.g., a folding operation) or a data integrity check on the block. The data integrity check can identify a data state metric value (e.g., a residual or raw bit error rate (RBER) value) for one or more wordlines of the block. The RBER corresponds to a number of bit errors per unit of time that the data stored at the block includes an error. In response to the data state metric value exceeding a refresh threshold criterion, the media manager component 113 can trigger the media management operation. In an example, the media management operation can write the data stored at the wordline or block to a new block to refresh the data stored by the memory sub-system 110.

The media manager component 113 can adjust the read operation counter related to media management operations using a read counter multiplier, as illustrated in VPASSR metadata tables 910-940. The read counter multiplier can be a value used to modify the rate at which the read operation counter is incremented. For example, using VPASSR metadata table 920, a block family can be assigned to bin 0, use a pass-through voltage identified by the high VPASSR setting (the base pass-through voltage), and apply a read counter multiplier of 1 (e.g., read counter increments are unchanged). The block family can then be assigned to bin 2 to adjust the read threshold voltages. The media manager component 113 can then, using VPASSR metadata table 920, set the pass-through voltage for the blocks in the block family to the pass-through voltage correlating to the medium setting, and apply the read counter multiplier value of 0.8 to each read operation counter increment of 1 given that a read operation with medium pass through voltage causes less read disturb. As such, each read operation will increase the read operation counter by a value of 0.8. Accordingly, more read operations are required to reach the scan threshold criterion and trigger a media management operation or a data integrity check on the block. It is noted that the read counter multiplier values are for illustrative purposes only, and that any values for the read counter multiplier can be used.

SCL and TVS is a function of PEC, such that SCL is slower at earlier cycles compared to later cycles. Furthermore, distributions might widen with PECs due to, for example, block endurance variance. Thus, in some embodiments, the media manager component 113 can maintain a database of blocks having similar number of PECs. In some embodiments, the media manager component 113 can group the blocks using a wear-leveling algorithm. The wear-leveling algorithm can group blocks in response to the PEC of a block exceeding a threshold criterion. For example, blocks with 1000 or fewer PECs can be placed into group 1, blocks with more than 1000 PECs and 2000 or fewer PECs can be placed into group 2, blocks with more than 2000 PECs and 3000 or fewer PECs can be placed into group 3, and so forth. In some embodiments, each group can be assigned a corresponding offset value ($OV_1$, $OV_2$ ... $OV_5$) and a counter multiplier, as discussed in relation to metadata tables 910 and 930. In other embodiments, each group can be assigned a VPASSR setting and a counter multiplier, as discussed in relation to metadata tables 920 and 940. Accordingly, media manager component 113 can determine the pass-through voltage of a block based on a PEC value of the block (e.g., amount of PECs performed on the block, which group the block is placed into, etc.). For example, media manager component 113 can determine a PEC value of the block or detect whether a PEC value of the block exceeds a threshold criterion using, for example a metadata table, and determine a pass-through voltage for the block based on the metadata table which can indicate the pass-through voltage as a function of the PEC value of the block.

Figure 10:
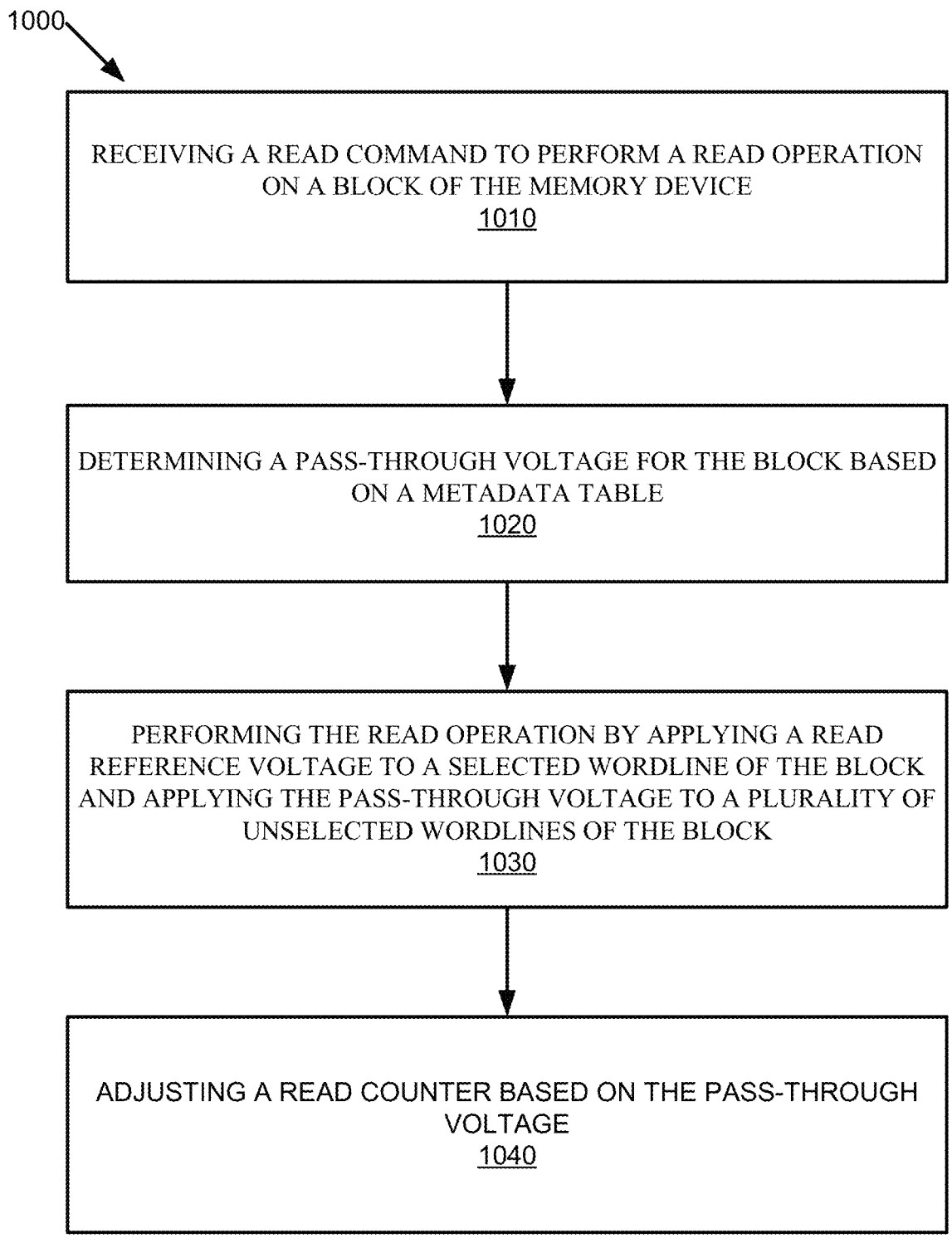
FIG. 10 is a flow diagram of an example method for adjusting the pass-through voltage, in accordance with some embodiments of the present disclosure.

FIG. 10 is a flow diagram of an example method 1000 for adjusting the pass-through voltage, in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the media manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1010, the processing logic receives a read command to perform a read operation on a block of the memory device.

At operation 1020, the processing logic determines a pass-through voltage for the block based on a metadata table. In some embodiments, determining the pass-through voltage includes determining a pass-through voltage offset value and applying the pass-through voltage offset value to a base pass-through voltage value. In some embodiments, determining the pass-through voltage includes determining a pass-through voltage setting and determining the pass-through voltage based on the pass-through voltage setting (e.g., VPASSR setting).

At operation 1030, the processing logic performs the read operation by applying a read reference voltage to a selected wordline of the block and applying the pass-through voltage to a plurality of unselected wordlines of the block.

At operation 1040, the processing logic adjusts a read operation counter based on the pass-through voltage value. In some embodiments, the read operations counter can be adjusted using a read counter multiplier. The read operation counter can be associated with triggering a media management operation.

In some embodiments, the processing logic can detect a read reference voltage calibration event associated with the block of the memory device and determine a new pass-through voltage for the block based on a metadata table. In some embodiments, the read reference voltage calibration event can include the block family associated with the block being assigned to a new predefined threshold voltage offset bin. In some embodiments, the read reference voltage calibration event can include the read reference voltage of the block (or block family the block is associated with) being adjusted in response to a TAP value satisfying a threshold criterion (e.g., exceeding a TAP threshold value).

Figure 11:
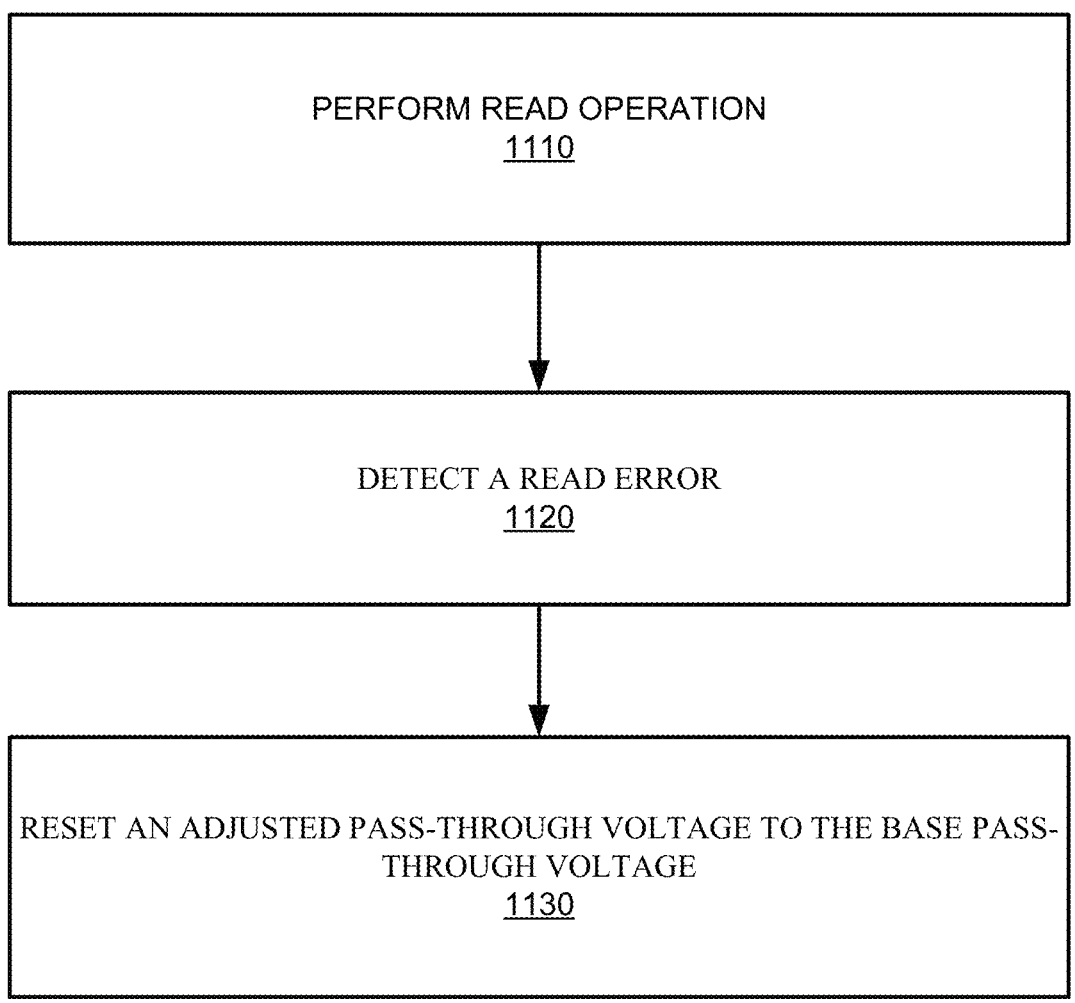
FIG. 11 is a flow diagram of another example method for resetting an adjusted pass-through voltage, in accordance with some embodiments of the present disclosure.

FIG. 11 is a flow diagram of an example method 1100 for resetting an adjusted pass-through voltage, in accordance with some embodiments of the present disclosure. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the media manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible At operation 1110, the processing logic performs a read operation. For example, the media manager component 113 can identify or indicate a read operation to be used by memory device 130 and/or memory device 140 to retrieve data (e.g., pages) that is stored at a particular location of memory device 130, 140.

At operation 1120, the processing logic detects a read error.

At operation 1130, the processing logic resets an adjusted pass-through voltage to the base pass-through voltage. In some embodiments, the base pass-through voltage can be the value assigned immediately after the block(s) was programmed (e.g., the "high" VPASSR setting). In other embodiments, the base pass-through voltage is one to which no pass-through voltage offset values are applied. As such, the base pass-through voltage is greater than the adjusted pass-through voltage. At this point, the processing logic can perform another read operation. If a read error is detected again, the processing logic can enter into error handling and or control operations.

Figure 12:
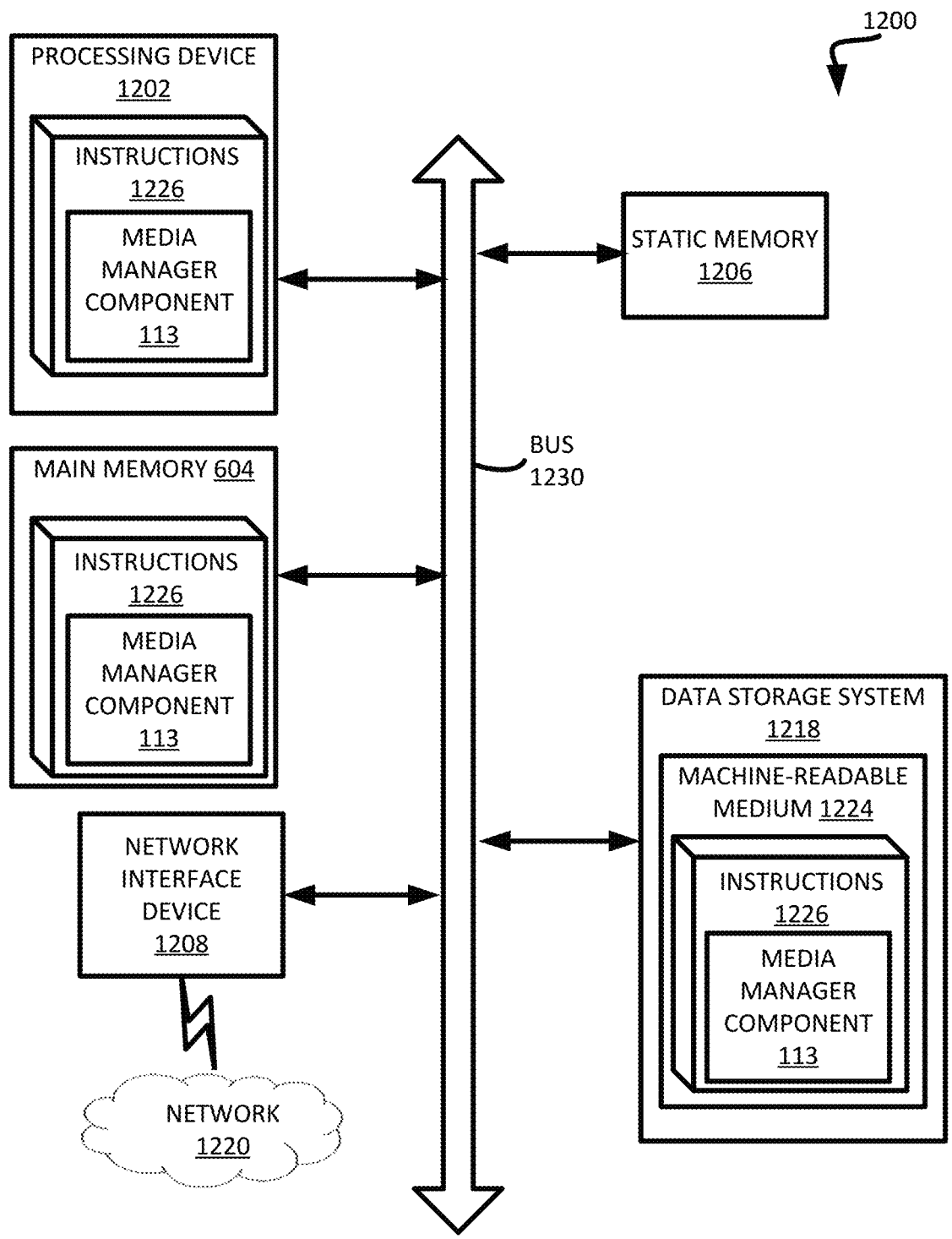
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to media manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a data storage system 1218, which communicate with each other via a bus 1230. Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium) on which is stored one or more sets of instructions 1226 or software embodying any one or more of the methodologies or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1226 include instructions to implement functionality corresponding to media manager component 113 of FIG. 1. While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled to the memory device, to perform operations comprising:
      performing a read operation on a block of the memory device by applying a read reference voltage to a selected wordline of the block and applying a pass-through voltage having an adjusted value to a plurality of unselected wordlines of the block;
      detecting a read error in response to performing the read operation; and
      setting the pass-through voltage to a base value that is greater than the adjusted value.

2. The system of claim 1, wherein the operations further comprise:
   determining the pass-through voltage by determining a pass-through voltage offset value and applying the pass-through voltage offset value to a base pass-through voltage value.

3. The system of claim 1, wherein the operations further comprise:

determining the pass-through voltage by determining a pass-through voltage setting and determining the pass-through voltage based on the pass-through voltage setting.

4. The system of claim 1, wherein the operations further comprise:
adjusting a read counter based on the pass-through voltage.

5. The system of claim 1, wherein the operations further comprise:
detecting a read reference voltage calibration event associated with the block of the memory device; and
determining a new pass-through voltage for the block based on a metadata table which indicates the new pass-through voltage as a function of the read reference voltage calibration event.

6. The system of claim 5, wherein detecting the read reference voltage calibration event comprises detecting a block family associated with the block being assigned to a new predefined threshold voltage offset bin.

7. The system of claim 5, wherein detecting the read reference voltage calibration event comprises detecting a time after programming (TAP) value of the block exceeding a threshold criterion.

8. The system of claim 5, wherein detecting the read reference voltage calibration event comprises:
detecting a program-erase cycle (PEC) value of the block exceeding a threshold criterion; and
determining the pass-through voltage based on the PEC value.

9. A method, comprising:
performing a read operation on a block of a memory device by applying a read reference voltage to a selected wordline of the block and applying a pass-through voltage having an adjusted value to a plurality of unselected wordlines of the block;
detecting a read error in response to performing the read operation; and
setting the pass-through voltage to a base value that is greater than the adjusted value.

10. The method of claim 9, further comprising:
determining the pass-through voltage by determining a pass-through voltage offset value and applying the pass-through voltage offset value to a base pass-through voltage value.

11. The method of claim 9, further comprising:
determining the pass-through voltage by determining a pass-through voltage setting and determining the pass-through voltage based on the pass-through voltage setting.

12. The method of claim 9, further comprising:
adjusting a read counter based on the pass-through voltage.

13. The method of claim 9, further comprising:
detecting a read reference voltage calibration event associated with the block of the memory device; and
determining a new pass-through voltage for the block based on a metadata table which indicates the new pass-through voltage as a function of the read reference voltage calibration event.

14. The method of claim 13, wherein detecting the read reference voltage calibration event comprises detecting a block family associated with the block being assigned to a new predefined threshold voltage offset bin.

15. The method of claim 13, wherein detecting the read reference voltage calibration event comprises detecting a time after programming (TAP) value of the block exceeding a threshold criterion.

16. The method of claim 13, wherein detecting the read reference voltage calibration event comprises:
detecting a program-erase cycle (PEC) value of the block exceeding a threshold criterion; and
determining the pass-through voltage based on the PEC value.

17. A non-transitory computer-readable storage medium comprising instructions that, when executed by a processing device operatively coupled to a memory, performs operations comprising:
performing a read operation on a block of a memory device by applying a read reference voltage to a selected wordline of the block and applying a pass-through voltage having an adjusted value to a plurality of unselected wordlines of the block;
detecting a read error in response to performing the read operation; and
setting the pass-through voltage to a base value that is greater than the adjusted value.

18. The non-transitory computer-readable storage medium of claim 17, wherein the operations further comprise:
determining the pass-through voltage by determining a pass-through voltage offset value and applying the pass-through voltage offset value to a base pass-through voltage value.

19. The non-transitory computer-readable storage medium of claim 17, wherein the operations further comprise:
determining the pass-through voltage by determining a pass-through voltage setting and determining the pass-through voltage based on the pass-through voltage setting.

20. The non-transitory computer-readable storage medium of claim 17, wherein the operations further comprise:
detecting a read reference voltage calibration event associated with the block of the memory device; and
determining a new pass-through voltage for the block based on a metadata table which indicates the new pass-through voltage as a function of the read reference voltage calibration event.

* * * * *